(12) United States Patent
Hashimoto et al.

(10) Patent No.: US 11,439,025 B2
(45) Date of Patent: Sep. 6, 2022

(54) METHOD FOR FORMING CIRCUIT

(71) Applicant: FUJI CORPORATION, Chiryu (JP)

(72) Inventors: Yoshitaka Hashimoto, Kariya (JP); Masatoshi Fujita, Anjyo (JP); Kenji Tsukada, Toyota (JP); Akihiro Kawajiri, Chiryu (JP); Masato Suzuki, Miyoshi (JP); Katsuaki Makihara, Gamagori (JP)

(73) Assignee: FUJI CORPORATION, Chiryu (JP)

( * ) Notice: Subject to any disclaimer, the term of this patent is extended or adjusted under 35 U.S.C. 154(b) by 318 days.

(21) Appl. No.: 16/301,076

(22) PCT Filed: Jun. 8, 2016

(86) PCT No.: PCT/JP2016/067045
§ 371 (c)(1),
(2) Date: Nov. 13, 2018

(87) PCT Pub. No.: WO2017/212567
PCT Pub. Date: Dec. 14, 2017

(65) Prior Publication Data
US 2020/0163217 A1  May 21, 2020

(51) Int. Cl.
*H05K 3/28* (2006.01)
*H05K 3/12* (2006.01)
*H05K 3/30* (2006.01)
*H05K 3/32* (2006.01)
(Continued)

(52) U.S. Cl.
CPC ............. *H05K 3/287* (2013.01); *H05K 3/125* (2013.01); *H05K 3/28* (2013.01); *H05K 3/284* (2013.01);
(Continued)

(58) Field of Classification Search
CPC ........ H05K 3/287; H05K 3/285; H05K 3/284; H05K 3/28; H05K 3/32; H05K 3/303;
(Continued)

(56) References Cited

U.S. PATENT DOCUMENTS 5,427,642 A * 6/1995 Akiguchi ............... C09J 201/00
156/273.3
5,846,853 A * 12/1998 Otsuki ................... H01L 21/563
438/119
(Continued)

FOREIGN PATENT DOCUMENTS

JP          8-88316 A      4/1996
JP       2003-110245 A    4/2003
(Continued)

OTHER PUBLICATIONS

International Search Report dated Jul. 19, 2016 in PCT/JP2016/067045 filed Jun. 8, 2016.

*Primary Examiner* — Jeffrey T Carley
(74) *Attorney, Agent, or Firm* — Oblon, McClelland, Maier & Neustadt, L.L.P.

(57) ABSTRACT

In a circuit forming device, a resin laminated body is formed by curing an ultraviolet curable resin ejected by an ejecting device. Then, ultraviolet curable resin is ejected into a cavity of the resin laminated body, and an electronic component is placed on the ultraviolet curable resin. Then, the electronic component is cured and the electronic component is fixed.

4 Claims, 6 Drawing Sheets

(51) Int. Cl.
*H05K 1/18* (2006.01)
*H05K 3/00* (2006.01)

(52) U.S. Cl.
CPC ............... H05K 3/285 (2013.01); H05K 3/30 (2013.01); H05K 3/303 (2013.01); H05K 3/32 (2013.01); *H05K 1/185* (2013.01); *H05K 3/0014* (2013.01); *H05K 2203/013* (2013.01); *H05K 2203/107* (2013.01); *H05K 2203/1316* (2013.01); *H05K 2203/1322* (2013.01); *H05K 2203/1327* (2013.01); *H05K 2203/1377* (2013.01)

(58) Field of Classification Search
CPC ............. H05K 3/30; H05K 2203/1327; H05K 2203/1316; H05K 2203/1377; H05K 2203/1322; H05K 1/185
See application file for complete search history.

(56) References Cited

U.S. PATENT DOCUMENTS

| | | | |
|---|---|---|---|
| 7,521,293 B2 * | 4/2009 | Ogata | H01L 21/563 438/108 |
| 2002/0185747 A1 * | 12/2002 | Hashimoto | H01L 23/3114 257/778 |
| 2006/0068525 A1 * | 3/2006 | Uehara | H05K 3/125 438/125 |
| 2008/0029930 A1 * | 2/2008 | Ito | B29C 45/0025 264/272.17 |
| 2008/0104832 A1 | 5/2008 | Shintate | |
| 2011/0240355 A1 * | 10/2011 | Nakamura | H01L 24/98 174/260 |
| 2012/0091594 A1 * | 4/2012 | Landesberger | H01L 23/552 257/774 |
| 2013/0161782 A1 | 6/2013 | Rajendran et al. | |
| 2013/0261262 A1 * | 10/2013 | Cox | C08L 75/14 525/217 |
| 2016/0316566 A1 * | 10/2016 | Sakai | H05K 3/4644 |

FOREIGN PATENT DOCUMENTS

| | | |
|---|---|---|
| JP | 2003-298005 A | 10/2003 |
| JP | 2012-256769 A | 12/2012 |
| JP | 2013-135212 A | 7/2013 |
| JP | 2014-183179 A | 9/2014 |
| WO | 2015/111922 A1 | 7/2015 |
| WO | WO 2016/042657 A1 | 3/2016 |

* cited by examiner

METHOD FOR FORMING CIRCUIT

TECHNICAL FIELD

The present application relates to a method for forming circuit that forms a circuit in which a component is mounted on a board.

BACKGROUND ART

When a circuit in which a component is mounted on a board is to be formed, it is necessary to fix the component at the board. The patent literatures below each disclose a technology for fixing a component at a board by using, for example, an adhesive.
PTL 1: Japanese Unexamined Patent Application Publication No. 8-088316
PTL 2: Japanese Unexamined Patent Application Publication No. 2003-298005

BRIEF SUMMARY

Technical Problem

According to the technologies disclosed in the patent literatures above, it is possible to fix a component at a board. However, in the technologies disclosed in the patent literatures above, it is necessary to, for example, dispose a dispenser head for ejecting an adhesive, and problems in, for example, installation costs and installation space of the dispenser head exist. For example, there may be a case in which a resin-based adhesive is semi-cured with heat by an electric furnace or the like, and a component is placed on the resin that has been semi-cured; however, a problem exists in that throughput is reduced due to the time for semi-curing the resin-based adhesive with heat. In this way, the methods of forming a circuit in which a component is mounted on a board have various problems; and, by solving the various problems, the practicality of the methods of forming a circuit in which a component is mounted on a board is improved. The present disclosure is made in view of the above-described circumstances, and an object thereof is to provide a highly practical method for forming circuit.

Solution to Problem

To solve the problems above, a method for forming circuit of the present disclosure is a method for forming circuit of, by using a resin layer in which an ultraviolet curable resin ejected by an ejecting device is cured, forming a circuit in which a component is mounted on a board; and comprises an ejection step of ejecting the ultraviolet curable resin onto a planned mounting position of the component by the ejecting device, an amount of the ultraviolet curable resin corresponding to at least one of a size and a weight of the component, a placement step of placing the component onto the ultraviolet curable resin ejected in the ejection step, and a fixation step of fixing the component placed in the placement step by irradiating the ultraviolet curable resin ejected in the ejection step with ultraviolet rays.

A method for forming circuit of the present disclosure is a method for forming circuit of, by using a resin layer in which an ultraviolet curable resin ejected by an ejecting device is cured, forming a circuit in which a component is mounted inside a cavity formed in a board; and comprises an ejection step of ejecting the ultraviolet curable resin onto an entire bottom face of the cavity by the ejecting device, a placement step of placing the component onto a predetermined position on the ultraviolet curable resin ejected in the ejection step, and a fixation step of fixing the component placed in the placement step by irradiating the ultraviolet curable resin ejected in the ejection step with ultraviolet rays.

Advantageous Effects

In the method for forming circuit of the present disclosure, by curing an ultraviolet curable resin ejected by the ejecting device, a resin layer is formed to form a circuit by using the resin layer. Then, a component is fixed by the ultraviolet curable resin that is ejected by the ejecting device. That is, in the method for forming circuit of the present disclosure, the resin layer is formed when forming the circuit; however, the component is fixed by the ultraviolet curable resin for forming the resin layer. Therefore, the component is fixed by using facilities of related art. This solves the problems of, for example, costs and installation space required for new facilities. Since the ultraviolet curable resin is cured by only irradiating the ultraviolet curable resin with ultraviolet rays, it is possible to reduce the time required for fixing the component and prevent a reduction in throughput. For example, by causing the ejection amount of the ultraviolet curable resin for fixing the component to correspond with at least one of the size and the weight of the component, as described in detail later, it is possible to properly mount the component at a planned mounting position by a self-alignment effect. For example, when the component is to be mounted on the bottom face of the cavity, the ultraviolet curable resin is ejected to the entire bottom face of the cavity. Then, the component is placed at a predetermined position of the ejected ultraviolet curable resin, and the component is fixed by the ultraviolet curable resin. This causes the fixation of the component to the bottom face of the cavity and the formation of the resin layer that covers the bottom face of the cavity to be performed at the same time, and throughput to be increased. In this way, according to the present disclosure, it is possible to improve the practicality of the method for forming circuit.

DESCRIPTION OF EMBODIMENTS

First Embodiment

Configuration of Circuit Forming Device

Figure 1:
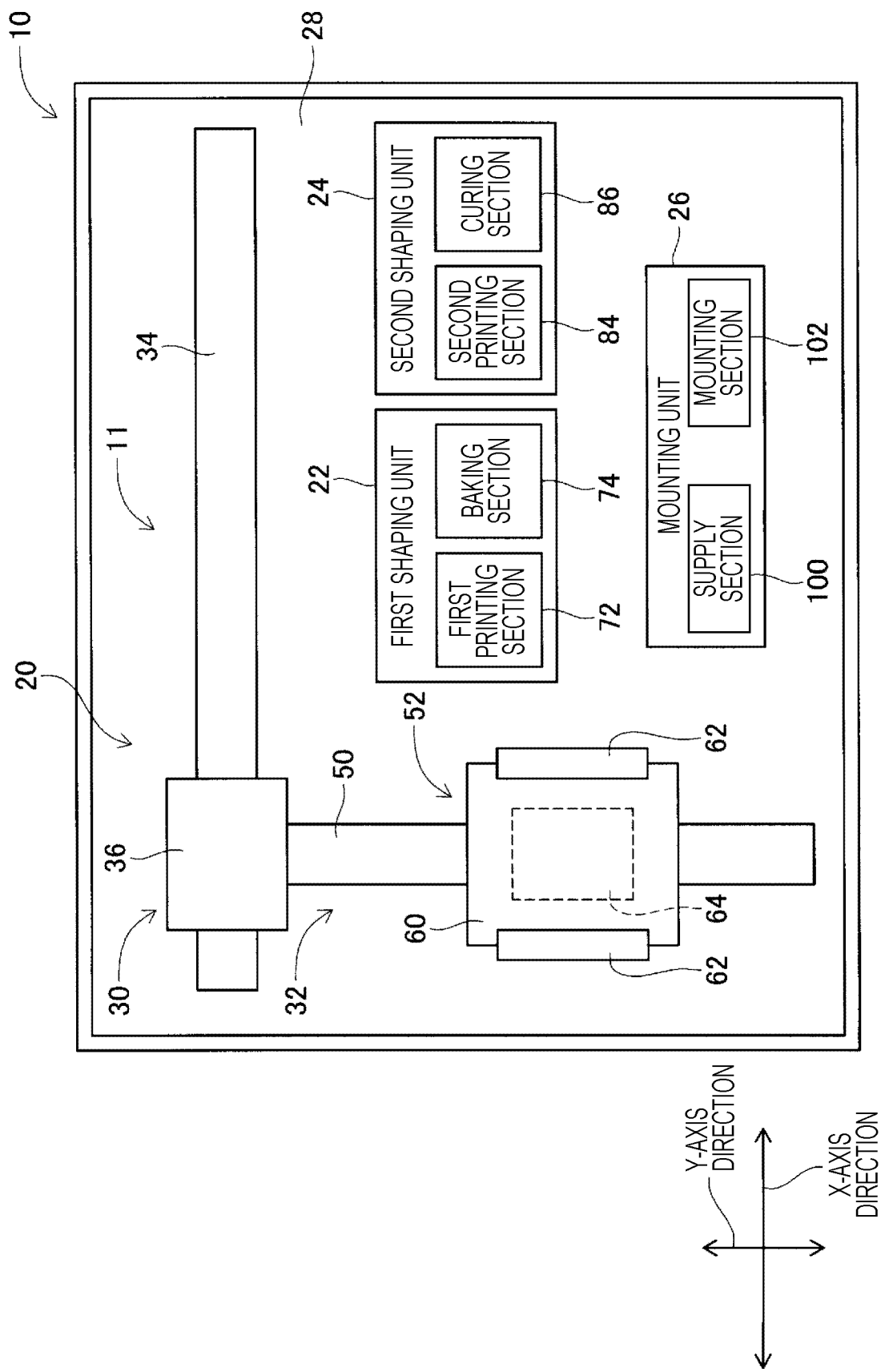
FIG. 1 illustrates a circuit forming device.

FIG. 1 illustrates circuit forming device 10. Circuit forming device 10 is provided with conveyance device 20, first shaping unit 22, second shaping unit 24, mounting unit 26, and control device (see FIG. 2) 27. Conveyance device 20, first shaping unit 22, second shaping unit 24, and mounting unit 26 are disposed on base 28 of circuit forming device 10. Base 28 generally has a rectangular shape; and, in the description below, the longitudinal direction of base 28 is called an X-axis direction, the lateral direction of base 28 is called a Y-axis direction, and a direction orthogonal to both the X-axis direction and the Y-axis direction is called a Z-axis direction, and the description is given.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed on base 28 so as to extend in the X-axis direction. X-axis slider 36 is held by X-axis slide rail 34 so as to be slidable in the X-axis direction. Further, X-axis slide mechanism 30 includes electromagnetic motor (see FIG. 2) 38, and X-axis slider 36 moves to any position in the X-axis direction by driving electromagnetic motor 38. Y-axis slide mechanism 32 includes Y-axis slide rail 50 and stage 52. Y-axis slide rail 50 is disposed on base 28 so as to extend in the Y-axis direction, and is movable in the X-axis direction. One end portion of Y-axis slide rail 50 is connected to X-axis slider 36. Stage 52 is held by Y-axis slide rail 50 so as to be slidable in the Y-axis direction. Further, Y-axis slide mechanism 32 includes electromagnetic motor (see FIG. 2) 56, and stage 52 moves to any position in the Y-axis direction by driving electromagnetic motor 56. This causes stage 52 to move to any position on base 28 by driving X-axis slide mechanism 30 and Y-axis slide mechanism 32.

Stage 52 includes base table 60, holding devices 62, and lifting and lowering device 64. Base table 60 has a planar shape, and a board is placed on an upper face of base table 60. Holding devices 62 are each provided on a corresponding one of two side portions in the X-axis direction of base table 60. By interposing between holding devices 62 two edge portions in the X-axis direction of the board placed on base table 60, the board is fixedly held. Lifting and lowering device 64 is disposed below base table 60 and lifts and lowers base table 60.

First shaping unit 22 is a unit that shapes a wiring on board (see FIG. 3) 70 placed on base table 60 of stage 52, and includes first printing section 72 and baking section 74.

First printing section 72 includes inkjet head (see FIG. 2) 76, and ejects metal ink in the form of a line onto board 70 placed on base table 60. Metal ink contains metal particles dispersed in a solvent. Note that inkjet head 76 ejects, for example, conductive materials from multiple nozzles by using a piezoelectric system using a piezoelectric element.

Baking section 74 includes laser irradiation device (see FIG. 2) 78. Laser irradiation device 78 is a device that irradiates the metal ink ejected onto board 70 with laser; and bakes the metal ink irradiated with the laser to form a wiring. Note that baking of metal ink is a phenomenon that, by applying energy, performs, for example, vaporization of solvent or breakdown of metal particle protective coating, and increases conductivity by making the metal particles contact or fuse. Then, a metal wiring is formed by the metal ink being baked.

Second shaping unit 24 is a unit that shapes a resin layer on board 70 placed on base table 60 of stage 52; and includes second printing section 84 and curing section 86. Second printing section 84 includes inkjet head (see FIG. 2) 88 and ejects an ultraviolet curable resin onto board 70 placed on base table 60. Note that inkjet head 88 may be, for example, a piezoelectric system using a piezoelectric element or a thermal system that heats resin, generates bubbles, and ejects the bubbles from the nozzles.

Curing section 86 includes flattening device (see FIG. 2) 90 and irradiation device (see FIG. 2) 92. Flattening device 90 flattens the upper face of the ultraviolet curable resin ejected onto board 70 by inkjet head 88; and, by scraping up by a roller or a blade excess resin while leveling the face of the ultraviolet curable resin, causes the thickness of the ultraviolet curable resin to become uniform. Irradiation device 92 is also provided with a mercury lamp or an LED, as a light source, and irradiates the ultraviolet curable resin ejected onto board 70 with ultraviolet rays. This causes the ultraviolet curable resin ejected onto board 70 to be cured to shape the resin layer.

Mounting unit 26 is a unit that mounts electronic components (see FIG. 6) 96 onto board 70 placed on base table 60 of stage 52; and includes supply section 100 and mounting section 102. Supply section 100 includes multiple tape feeders (see FIG. 2) 110 that feed taped electronic components 96 one at a time, and supplies electronic components 96 at supply positions. Note that supply section 100 is not limited to tape feeders 110, and may be a tray-type supply device that picks up electronic components 96 from a tray and supplies the electronic components 96. Supply section 100 may be both a tape type and a tray type, or may have a structure provided with any other type of supply device.

Mounting section 102 includes mounting head (see FIG. 2) 112 and moving device (see FIG. 2) 114. Mounting head 112 includes suction nozzle (see FIG. 6) 118 for picking up and holding electronic components 96. By being supplied with negative pressure from a positive and negative pressure supply device (not illustrated), suction nozzle 118 picks up and holds electronic components 96 by air suction. Then, by being supplied with a slight positive pressure from the positive and negative pressure supply device, suction nozzle 118 separates from electronic components 96. Moving device 114 moves mounting head 112 to a location between the supply positions of electronic components 96 based on tape feeders 110 and board 70 placed on base table 60. By this, in mounting section 102, electronic components 96 supplied from tape feeders 110 are held by suction nozzle 118, and electronic components 96 held by suction nozzle 118 are mounted on board 70.

Figure 2:
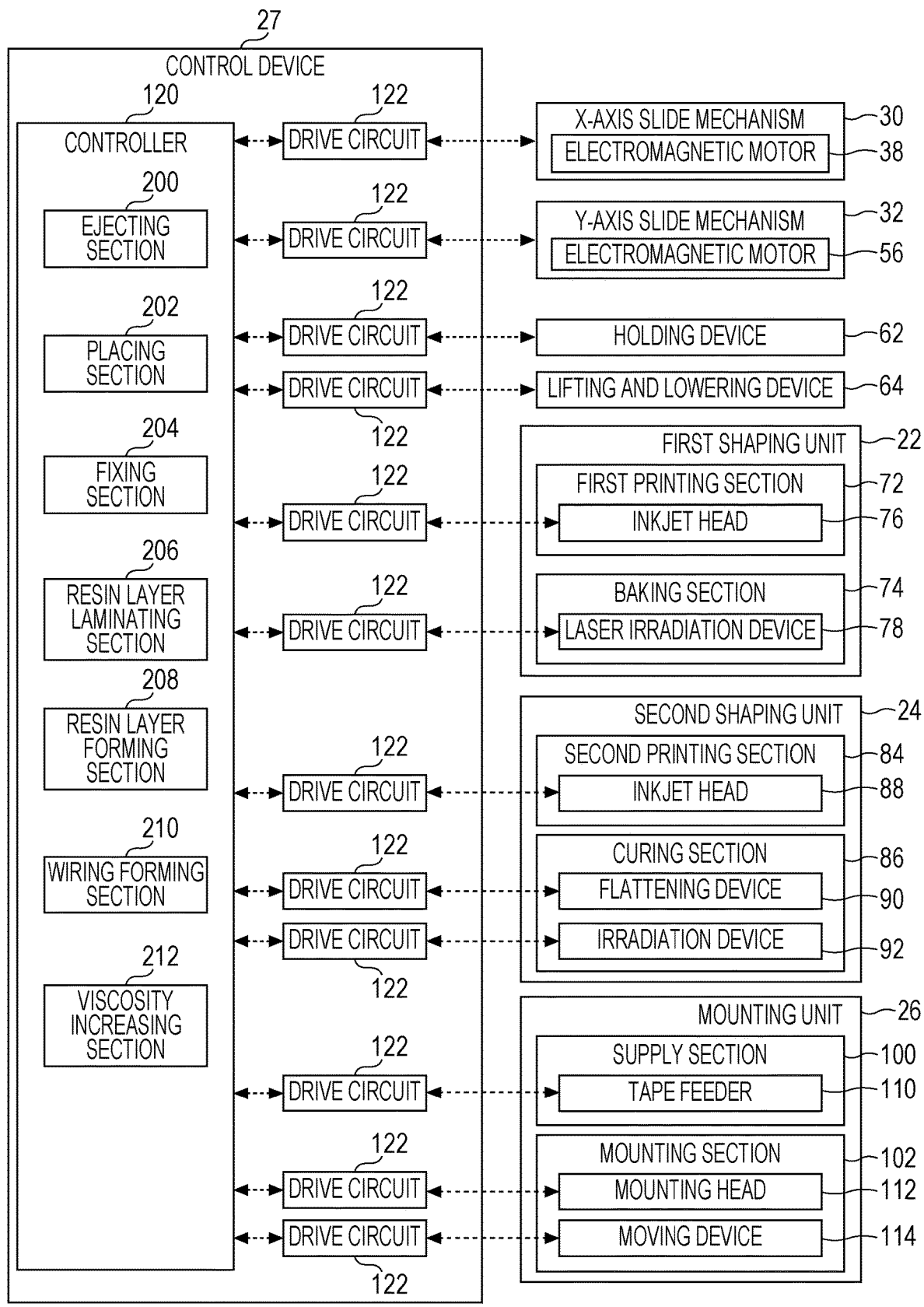
FIG. 2 is a block diagram showing a control device.

As shown in FIG. 2, control device 27 is provided with controller 120 and multiple drive circuits 122. Multiple drive circuits 122 are each connected to a corresponding one or ones of aforementioned electromagnetic motors 38 and 56, holding devices 62, lifting and lowering device 64, inkjet head 76, laser irradiation device 78, inkjet head 88, flattening device 90, irradiation device 92, tape feeders 110, mounting head 112, and moving device 114. Controller 120 is provided with, for example, CPU, ROM, and RAM, is mainly a computer, and is connected to multiple drive circuits 122. By this, operations of conveyance device 20, first shaping unit 22, second shaping unit 24, and mounting unit 26 are controlled by controller 120.

Operation of Circuit Forming Device

Figure 3:
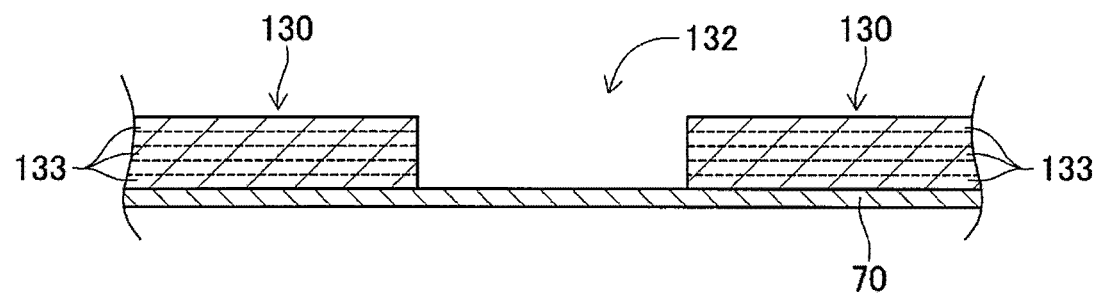
FIG. 3 is a sectional view showing a circuit in a state in which a resin laminated body has been formed.

In circuit forming device 10, due to the above-described configuration, a circuit is formed by mounting electronic components 96 onto board 70. Specifically, board 70 is set on base table 60 of stage 52, and stage 52 is moved to a location below second shaping unit 24. Then, in second shaping unit 24, as shown in FIG. 3, resin laminated body 130 is formed on board 70. Resin laminated body 130 includes cavity 132 for mounting electronic components 96, and, by repeating the ejection of an ultraviolet curable resin from inkjet head 88 and the irradiation of the ejected ultraviolet curable resin with ultraviolet rays by irradiation device 92, resin laminated body 130 is formed.

Specifically, in second printing section 84 of second shaping unit 24, inkjet head 88 ejects an ultraviolet curable resin in the form of a thin film onto the upper face of board 70. Here, inkjet head 88 ejects the ultraviolet curable resin such that a predetermined portion on the upper face of board 70 is exposed in a rectangular shape. Next, when the ultraviolet curable resin has been ejected in the form of a thin film, in curing section 86, the ultraviolet curable resin is flattened by flattening device 90 such that the film thickness of the ultraviolet curable resin becomes uniform. Then, irradiation device 92 irradiates the thin-film ultraviolet curable resin with ultraviolet rays. By this, a thin-film resin layer 133 is formed on board 70.

Next, inkjet head 88 ejects an ultraviolet curable resin in the form of a thin film onto only the portion of the thin-film resin layer 133. That is, inkjet head 88 ejects the ultraviolet curable resin in the form of a thin film onto the thin-film resin layer 133 such that the predetermined portion on the upper face of board 70 is exposed in a substantially rectangular shape. Then, by flattening the ultraviolet curable resin by flattening device 90 and irradiating the ultraviolet curable resin ejected in the form of a thin film by the irradiation device 92, thin-film resin layer 133 is laminated to thin-film resin layer 133. In this way, by repeating the ejection of an ultraviolet curable resin onto thin-film resin layer 133 excluding the substantially rectangular portion of the upper face of board 70 and the irradiation with ultraviolet rays, multiple resin layers 133 are laminated, thereby forming resin laminated body 130 having cavity 132.

Figure 4:
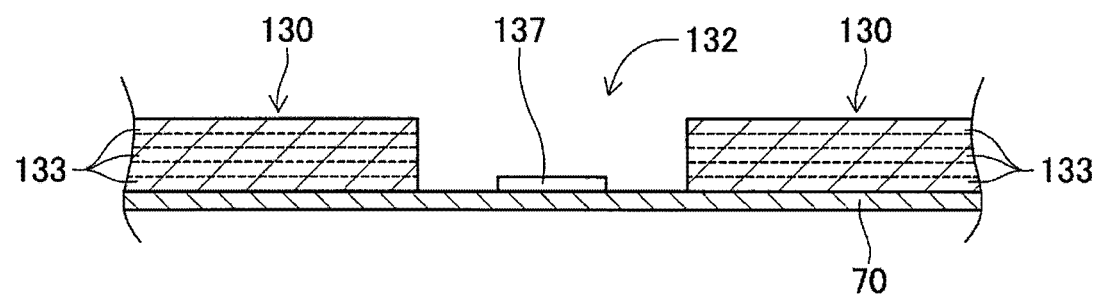
FIG. 4 is a sectional view showing the circuit in a state in which an ultraviolet curable resin has been ejected into a cavity.
Figure 5:
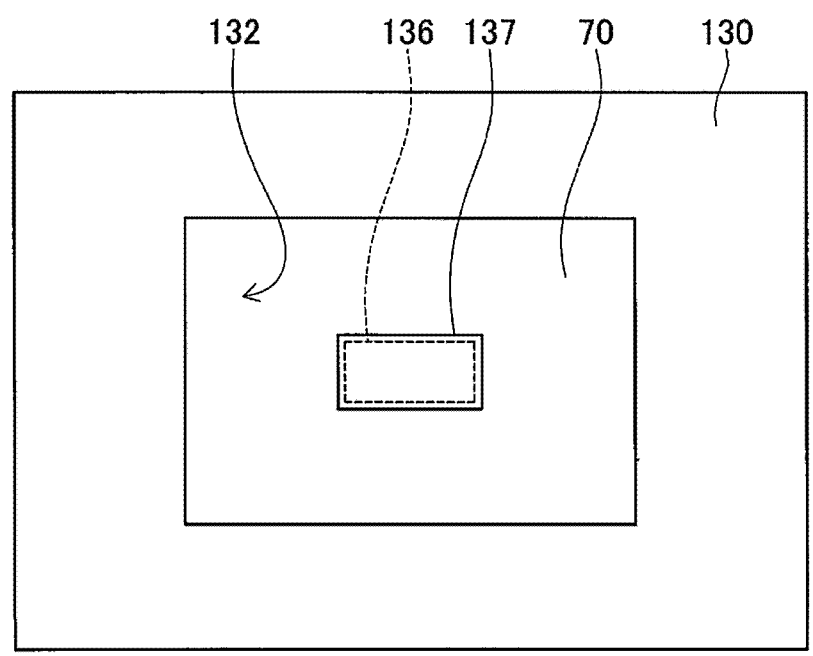
FIG. 5 is a plan view showing the circuit in the state in which the ultraviolet curable resin has been ejected into the cavity.

When resin laminated body 130 is formed by the above-described procedure, as shown in FIGS. 4 and 5, ultraviolet curable resin 137 is ejected by inkjet head 88 onto planned mounting position (see FIG. 5) 136 of electronic component 96 to be mounted on board 70. Specifically, the inside of cavity 132 of resin laminated body 130, that is, a predetermined position on board 70 that is exposed as bottom face of cavity 132 is planned mounting position 136 of electronic component 96, and ultraviolet curable resin 137 is ejected to planned mounting position 136. Here, the ejection amount of ultraviolet curable resin 137 is described in detail below; however, in order to properly mount electronic component 96, onto planned mounting position 136 by a self-alignment effect, the ejection amount is an amount corresponding to the size and weight of electronic component 96. Note that the shape at a visual point from above ultraviolet curable resin 137 that is ejected onto planned mounting position 136, that is, the ejection pattern of ultraviolet curable resin 137 is slightly larger than planned mounting position 136 due to the adjustment of ejection amount, and outer edges of ejected ultraviolet curable resin 137 are at equal distances from outer edges of planned mounting position 136. That is, the ejection pattern of ultraviolet curable resin 137 has the same shape as a mounting face of electronic component 96 when being mounted onto board 70, and has a size that is slightly larger than the size of the mounting race.

Figure 6:
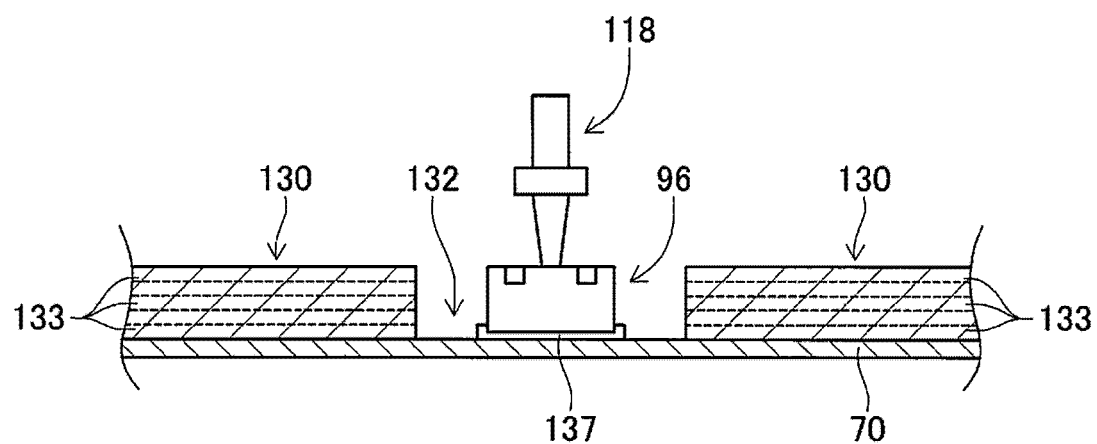
FIG. 6 is a sectional view showing the circuit in a state in which an electronic component has been placed inside the cavity.

Next, when ultraviolet curable resin 137 has been ejected into cavity 132 of resin laminated body 130, stage 52 is moved to a location below mounting unit 26. In mounting unit 26, electronic components 96 are supplied by tape feeders 110, and electronic components 96 are held by suction nozzle 118 of mounting head 112. Then, mounting head 112 is moved by moving device 114, and, as shown in FIG. 6, electronic component 96 held by suction nozzle 118 is placed on ejected ultraviolet curable resin 137 inside cavity 132 of resin laminated body 130. Note that the height of resin laminated body 130 is substantially the same as the height of electronic component 96.

Figure 7:
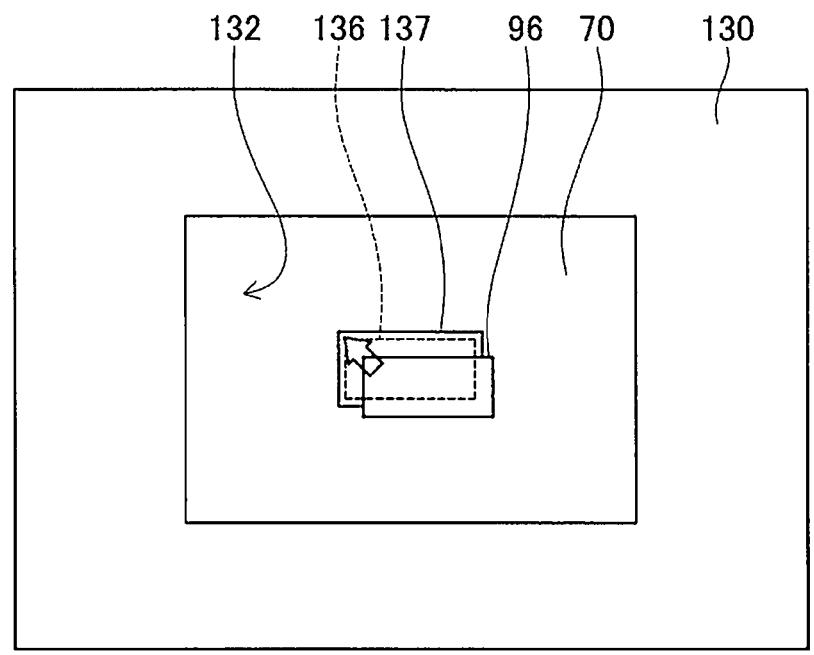
FIG. 7 is a plan view showing the circuit in the state in which the electronic component has been placed inside the cavity.
Figure 8:
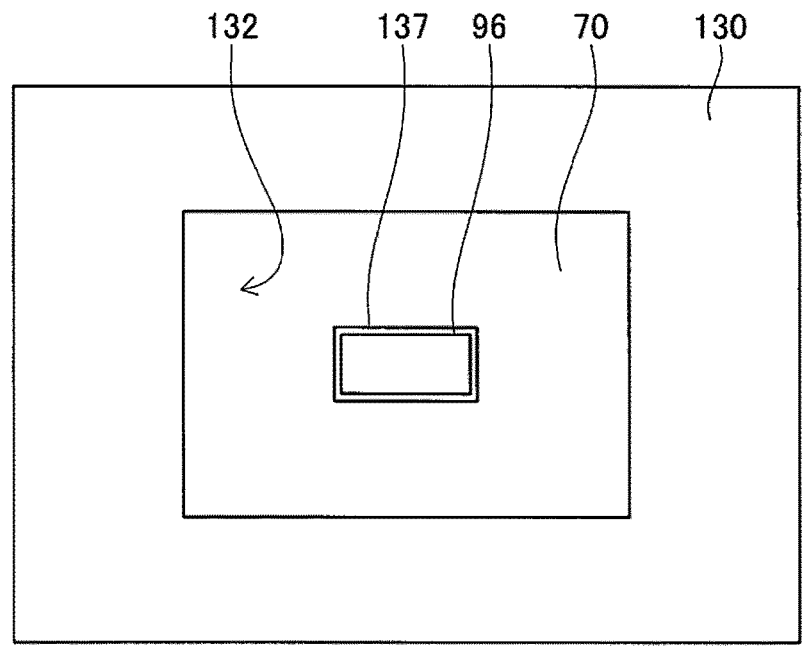
FIG. 8 is a plan view showing the circuit in the state in which the electronic component has been placed inside the cavity.

When electronic component 96 is placed on ultraviolet curable resin 137 ejected to planned mounting position 136, as shown in FIG. 7, electronic component 96 may be placed at a position that is displaced from planned mounting position 136. In such a case, electronic component 96 moves towards planned mounting position 136 by the self-alignment effect. That is, the placement position of electronic component 96 is corrected to planned mounting position 136 by the self-alignment effect. Specifically, the self-alignment effect is an effect in which a force that tries to make the amounts of ultraviolet curable resin 137 projecting from the outer edges of the mounting face of electronic component 96 the same causes electronic component 96 to move by the surface tension of ultraviolet curable resin 137. As described above, ultraviolet curable resin 137 is larger than planned mounting position 136, and the outer edges of ultraviolet curable resin 137 are at equal distances from the outer edges of planned mounting position 136. Therefore, as shown in FIG. 8, electronic component 96 placed at the position that is displaced from planned mounting position 136 is moved such that the distances between the outer edges thereof and the outer edges of ultraviolet curable resin 137 are the same. This causes the placement position of electronic component 96 to be corrected to planned mounting position 136.

However, when the amount of ultraviolet curable resin 137 is too small, the surface tension of ultraviolet curable resin 137 is weakened, and it may not be possible to move electronic component 96 by the surface tension. That is, it may not be possible to properly correct the placement position of electronic component 96 by the self-alignment effect. In contrast, when the amount of ultraviolet curable resin 137 is too large, electronic component 96 is in a floated state on ultraviolet curable resin 137, and, when stage 52 is moved, electronic component 96 floats and may be displaced from planned mounting position 136. In view of this, considering the weight of electronic component 96, the amount of ultraviolet curable resin 137 that causes electronic component 96 to be properly moved by the surface tension and that is capable of suppressing the floating of electronic component 96 is calculated, and ultraviolet curable resin 137 of this amount is ejected to planned mounting position 136.

Next, when electronic component 96 has been placed on ultraviolet curable resin 137, stage 52 moves to a location below second shaping unit 24, and, in curing section 86, ultraviolet curable resin 137 on which electronic component 96 has been placed is irradiated with ultraviolet rays by irradiation device 92. This cures ultraviolet curable resin 137, and fixes electronic component 96. Specifically, as shown in FIG. 6, due to the weight of electronic component 96, ultraviolet curable resin 137 on which electronic component 96, has been placed is caused to be in the form of a thin film below the mounting face of electronic component 96, and bulges at the outer edges so as to surround the lower ends of side faces of electronic component 96. Here, ultraviolet curable resin 137 is irradiated with ultraviolet rays and contracts slightly due to the curing of ultraviolet curable resin 137, and, by cured ultraviolet curable resin 137, electronic component 96 is fixedly sandwiched at the lower ends of the side faces of electronic component 96. Since ultraviolet curable resin 137 has adhesiveness to a certain extent, electronic component 96 is fixedly held by adhesive force at the mounting face of electronic component 96. This fixes electronic component 96 inside cavity 132. Note that, since ultraviolet curable resin 137 cured by the irradiation with ultraviolet rays fixes electronic component 96, ultraviolet curable resin 137 may be described as fixing layer 137.

Figure 9:
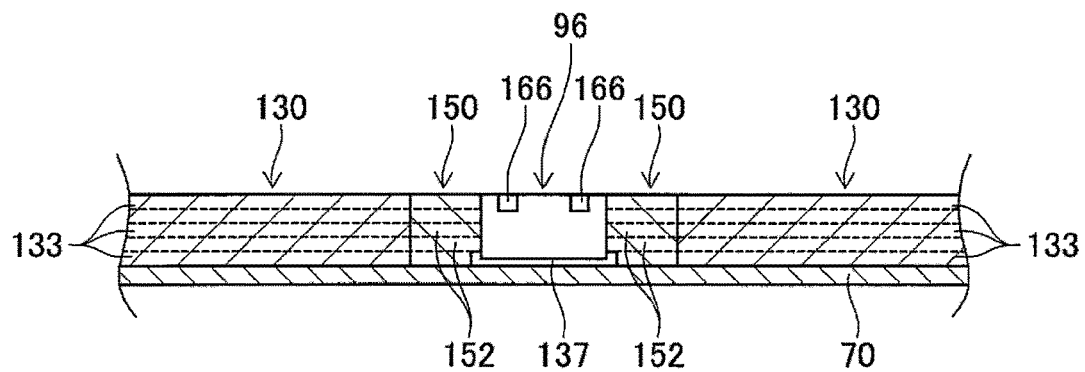
FIG. 9 is a sectional view showing the circuit in a state in which a resin laminated body has been formed in a gap of the cavity other than where the electronic component has been fixed.

Next, when electronic component 96 is fixed inside cavity 132, as shown in FIG. 9, resin laminated body 150 is formed in a gap of cavity, 132 other than where electronic component 96 is fixed. Specifically, in second printing section 84 of second shaping unit 24, inkjet head 88 ejects an ultraviolet curable resin in the form of a thin film to the upper face of board 70 that is exposed inside cavity 132, that is, to a location between an inner wall surface of cavity 132 and fixing layer 137. Next, when an ultraviolet curable resin has been ejected in the form of a thin film, irradiation device 92 irradiates the thin-film ultraviolet curable resin with ultraviolet rays. This causes thin-film resin layer 152 to be formed in the gap of cavity 132 other than where electronic component 96 is fixed.

Next, inkjet head 88 ejects an ultraviolet curable resin in the form of a thin film to a portion on thin-film resin layer 152 so as to cover the gap of cavity 132 other than where electronic component 96 is fixed. Then, by irradiating the ultraviolet curable resin ejected in the form of a thin film with ultraviolet rays by the irradiation device 92, thin-film resin layer 152 is laminated to thin-film resin layer 152. In this way, by repeating the ejection of an ultraviolet curable resin to the gap of cavity 132 other than where electronic component 96 is fixed and the irradiation using ultraviolet rays, multiple resin layers 152 are laminated, and resin laminated body 150 is formed in the gap of cavity 132 other than where electronic component 96 is fixed. Note that the height of resin laminated body 150 is substantially the same as the height of resin laminated body 130. This causes the upper face of resin laminated body 130 and the upper face of resin laminated body 150 to be flush with each other.

Figure 10:
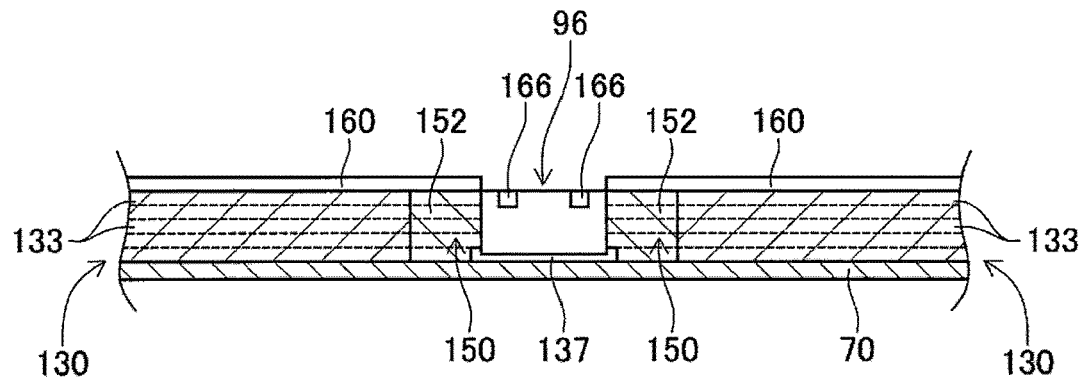
FIG. 10 is a sectional view showing the circuit in a state in which a resin layer has been formed on the resin laminated body.

Next, when resin laminated body 150 has been formed in the gap of cavity 132 other than where electronic component 96 is fixed, as shown in FIG. 10, resin layer 160 is formed over the upper face of resin laminated body 130 and the upper face of resin laminated body 150. Specifically, in a later step, wiring 168 that electrically connects electrodes 166 of electronic component 96 mounted on board 70 to other electrodes (not illustrated) is formed; however, inkjet head 88 ejects an ultraviolet curable resin in the form of a thin film to a planned formation position of wiring 168. That is, at the planned formation position of wiring 168, an ultraviolet curable resin is ejected in the form of a thin film over the upper face of resin laminated body 130 and the upper face of resin laminated body 150. Then, irradiation device 92 irradiates the thin-film ultraviolet curable resin with ultraviolet rays. By this, at the planned formation position of wiring 168, thin-film resin layer 160 is formed over the upper face of resin laminated body 130 and the upper face of resin laminated body 150.

Figure 11:
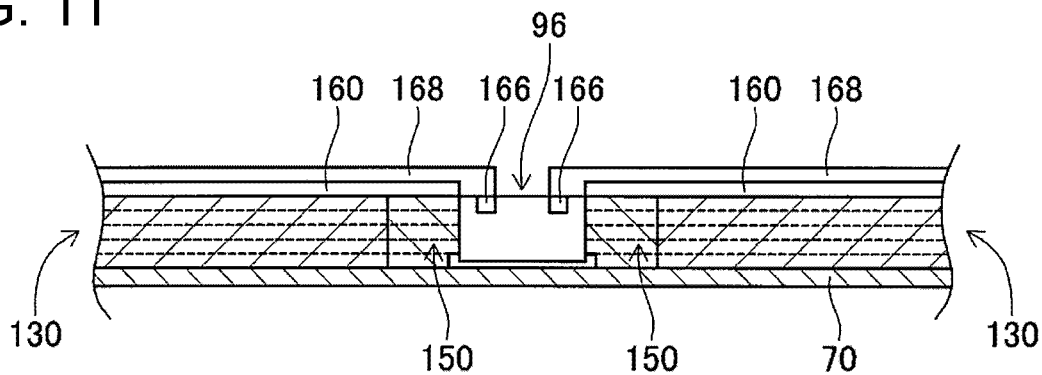
FIG. 11 is a sectional view showing the circuit in a state in which a wiring has been formed.

Next, when resin layer 160 has been formed over the upper face of resin laminated body 130 and the upper face of resin laminated body 150, stage 52 is moved to a location below first shaping unit 22. Then, in first printing section 72, inkjet head 76 ejects metal ink in the form of a line onto resin layer 160 in accordance with a circuit pattern. At this time, the metal ink is ejected in the form of a line so as to connect electrodes 166 of electronic component 96 and other electrodes (not illustrated). Next, in baking section 74, the ejected metal ink is irradiated with laser by laser irradiation device 78. By this, the metal ink is baked and, as shown in FIG. 11, wiring 168 that connects electrodes 166 of electronic component 96 and other electrodes is formed.

In this way, in circuit forming device 10, when fixing electronic component 96 to board 70, electronic component 96 is fixed with the ultraviolet curable resin. In contrast, in a circuit forming device of related art, a dispenser head that ejects an adhesive is provided, and electronic component 96 is fixed to board 70 with the adhesive that is ejected by the dispenser head. That is, in the circuit forming device of related art, it is necessary to dispose a dispenser head, as a result of which problems in, for example, installation costs and installation space of dispenser head exist. When fixing electronic component 96 with an adhesive, it is necessary to cure the adhesive with heat in, for example, an electric furnace, and a problem exists in that throughput is reduced.

In view of this, in circuit forming device 10, electronic component 96 is fixed to board 70 by using an ultraviolet curable resin for forming, for example, resin laminated body 130. That is, inkjet head 88 that ejects an ultraviolet curable resin is used in common in the step for forming, for example, resin laminated body 130 and the step for fixing electronic component 96. This makes it possible to overcome the problems in, for example, installation costs and installation space. When fixing electronic component 96 with an ultraviolet curable resin, the ultraviolet curable resin only needs to be irradiated with ultraviolet rays. Thus, it is possible to prevent a reduction in throughput.

In circuit forming device 10, resin layer 160 is formed on the planned formation position of wiring 168, and wiring 168 is formed on resin layer 160. In contrast, in the circuit forming device of related art, wiring 168 is formed over the upper face of resin laminated body 130 and the upper face of resin laminated body 150. However, since the ultraviolet ray irradiation amount with respect to the upper face of resin laminated body 130 and the ultraviolet ray irradiation amount with respect to the upper face of resin laminated body 150 differ greatly, the physical properties of the upper face of resin laminated body 130 and the physical properties of the upper face of resin laminated body 150 differ greatly. In this way, since wiring 168 is formed over the upper face of resin laminated body 130 and the upper face of resin laminated body 150 having different physical properties, it is necessary to adjust the baking conditions of metal ink, and this is very troublesome.

Specifically, as described above, resin laminated body 150 is formed by laminating multiple resin layers 152, and the upper face of resin laminated body 150 is the upper face of the last laminated resin layer 152 of multiple resin layers 152. Therefore, the upper face of resin laminated body 150 is irradiated with ultraviolet rays only when resin layer 152 that is laminated last is formed. In contrast, as described above, resin laminated body 130 is formed by laminating multiple resin layers 133, and the upper face of resin laminated body 130 is the upper face of the last laminated resin layer 133 of multiple resin layers 133. Therefore, when forming resin laminated body 130, the upper face of resin laminated body 130 is irradiated with ultraviolet rays only when resin layer 133 that is laminated last is formed. However, after resin laminated body 130 has been formed, resin laminated body 150 is formed adjacent to resin laminated body 130, and it is not possible to irradiate with ultraviolet rays only a location of formation of resin laminated body 150, that is, the gap of cavity 132 other than where electronic component 96 is fixed, and the upper face of resin laminated body 130 is also irradiated with ultraviolet rays. Therefore, the upper face of resin laminated body 130 is irradiated with ultraviolet rays each time multiple resin layers 152 are formed when forming resin laminated body 150. That is, compared to the upper face of resin laminated body 150, the upper face of resin laminated body 130 is irradiated with a very large amount of ultraviolet rays. Therefore, the physical properties, such as wettability and hardness, of the upper face of resin laminated body 130 differ greatly from the physical properties, such as wettability and hardness, of the upper face of resin laminated body 150. In this way, in order to eject metal ink over the upper face of resin laminated body 130 and the upper face of resin laminated body 150 having different physical properties, and properly bake the metal ink, it is necessary to change baking conditions for baking the metal ink ejected onto the upper face of resin laminated body 130 and baking conditions for ejecting the metal ink ejected onto the upper face of resin laminated body 150. That is, in the circuit forming device of related art, it is not possible to properly form wiring 168 unless the baking conditions are changed in accordance with portions of the metal ink.

In contrast, in circuit forming device 10, as described above, at the planned formation position of wiring 168, resin layer 160 is formed over the upper face of resin laminated body 130 and the upper face of resin laminated body 150. In addition, the ultraviolet ray irradiation amount with respect to resin layer 160 is substantially uniform over the entire region of resin layer 160, and the physical properties of resin layer 160 are substantially uniform over the entire region of resin layer 160. Therefore, the baking conditions when baking the metal ink ejected onto resin layer 160 can be the same over the entire region of the ejected metal ink. This makes it possible to, in circuit forming device 10, properly form wiring 168 in accordance with portions of the metal ink without changing the baking conditions.

Second Embodiment

In circuit forming device 10 of first embodiment, an ultraviolet curable resin of an amount corresponding to the size and weight of electronic component 96 to be mounted is ejected onto the bottom face of cavity 132, and electronic component 96 is fixed with the ultraviolet curable resin; however, in circuit forming device 10 of a second embodiment, an ultraviolet curable resin is ejected over entire bottom face of cavity 132, and electronic component 96 is fixed with the ultraviolet curable resin.

Figure 12:
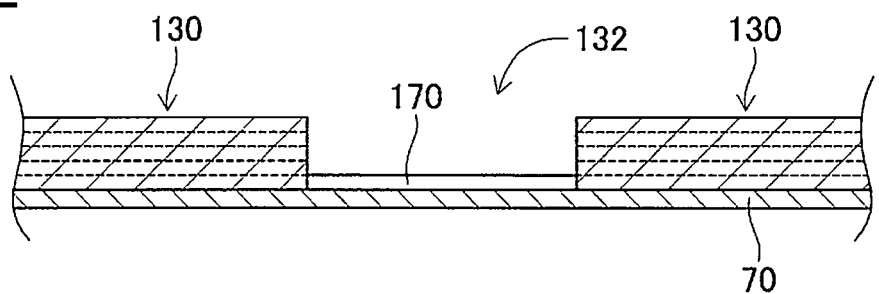
FIG. 12 is a sectional view showing a circuit in a state in which an ultraviolet curable resin has been ejected to the entire bottom face of a cavity.

Specifically, even in circuit forming device 10 of second embodiment, similarly to circuit forming device 10 of first embodiment, resin laminated body 130 having cavity 132 is formed on board 70. Then, as shown in FIG. 12, inkjet head 88 ejects ultraviolet curable resin 170 into cavity 132 of resin laminated body 130, that is, over the entire board 70 that is exposed as the bottom face of cavity 132. Then, ejected ultraviolet curable resin 170 is irradiated with ultraviolet rays by irradiation device 92. At this time, the ultraviolet ray irradiation amount with which ultraviolet curable resin 170 is irradiated is less than or equal to 10% of the ultraviolet ray irradiation amount required for completely curing ultraviolet curable resin 170. Therefore, ultraviolet curable resin 170 irradiated with ultraviolet rays is brought into a state of increased viscosity without being cured. Note that the ultraviolet ray irradiation amount ma be described as ultraviolet exposure amount and ultraviolet integrated light quantity, and is obtained by multiplying irradiation time to irradiation amount (ultraviolet illuminance, ultraviolet intensity) per unit time. The ultraviolet ray irradiation amount for increasing the viscosity without curing ultraviolet curable resin 170 differs depending upon the material making up the ultraviolet curable resin.

Next, when the viscosity is increased by the irradiation of ultraviolet curable resin 170 with ultraviolet rays, stage 52 is moved to a location below mounting unit 26. In mounting unit 26, electronic components 96 are supplied by tape feeders 110, and electronic components 96 are held by suction nozzle 118 of mounting head 112. Then, mounting head 112 is moved by moving device 114, and electronic component 96 held by suction nozzle 118 is placed at a predetermined position on ultraviolet curable resin 170 ejected to the entire bottom face of cavity 132, that is, on a planned mounting position of electronic component 96.

Figure 13:
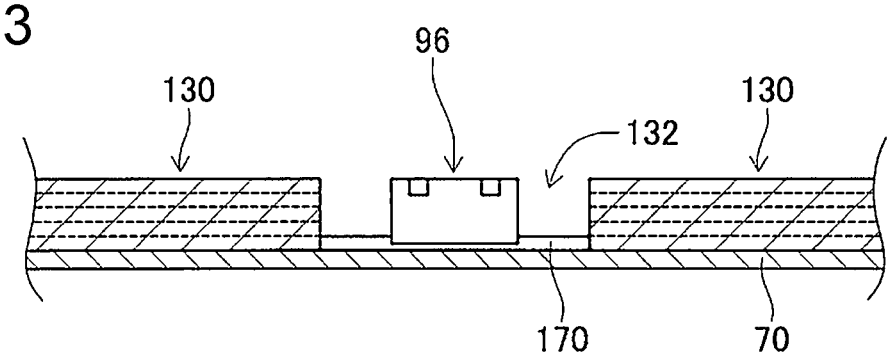
FIG. 13 is a sectional view showing the circuit in a state in which an electronic component has been placed inside the cavity.

Next, when electronic component 96 is placed on ultraviolet curable resin 170, stage 52 is moved to a location below second shaping unit 24, and, in curing section 86, ultraviolet curable resin 170 on which electronic component 96 has been placed is irradiated with ultraviolet rays by irradiation device 92. At this time, with the ultraviolet ray irradiation amount of previous irradiation being integrated, ultraviolet curable resin 170 is irradiated with ultraviolet rays so as to exceed an ultraviolet ray irradiation amount required for completely curing ultraviolet curable resin 170. This cures ultraviolet curable resin 170, and fixes electronic component 96. Specifically, as shown in FIG. 13, due to the weight of electronic component 96, ultraviolet curable resin 170 on which electronic component 96 has been placed is caused to be in the form of a thin film at a location below a mounting face of electronic component 96, and the upper face of ultraviolet curable resin 170 other than the location below the mounting face of electronic component 96 is positioned above the mounting face of electronic component 96. Therefore, the lower ends of side faces of electronic component 96 are surrounded by ultraviolet curable resin 170. Here, ultraviolet curable resin 170 is irradiated with ultraviolet rays and contracts slightly due to the curing of ultraviolet curable resin 170, and, by cured ultraviolet curable resin 170, electronic component 96 is fixedly sandwiched at the lower ends of the side faces of electronic component 96. By ultraviolet curable resin 170 having increased adhesiveness, electronic component 96 is fixedly held due to adhesive force at the mounting face. This fixes electronic component 96 inside cavity 132. Note that ultraviolet curable resin 170 cured by the ultraviolet ray irradiation may be described as fixing layer 170 for fixing electronic component 96.

Figure 14:
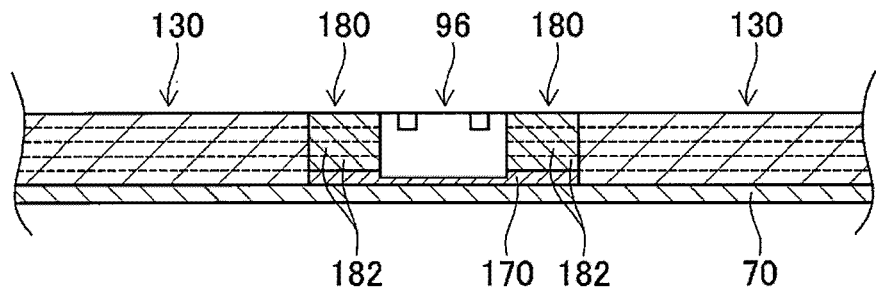
FIG. 14 is a sectional view showing the circuit in a state in which a resin laminated body has been formed in a gap of the cavity other than where the electronic component has been fixed.

Next, when electronic component 96 is fixed inside cavity 132, as shown in FIG. 14, resin laminated body 180 is formed in a gap of cavity 132 other than where electronic component 96 is fixed, that is, on the upper face of fixing layer 170 that is exposed. Specifically, in second printing section 84 of second shaping unit 24, inkjet head 88 ejects an ultraviolet curable resin in the form of a thin film onto the upper face of fixing layer 170 that is exposed inside cavity 132. Next, when an ultraviolet curable resin has been ejected in the form of a thin film, irradiation device 92 irradiates the thin-film ultraviolet curable resin with ultraviolet rays. This causes thin-film resin layer 182 to be formed on the upper face of fixing layer 170 that is exposed.

Next, inkjet head 88 ejects an ultraviolet curable resin in the form of a thin film onto thin-film resin layer 182 so as to cover the gap of cavity 132 other than where electronic component 96 is fixed. Then, by irradiating the ultraviolet curable resin ejected in the form of a thin film with ultraviolet rays by the irradiation device 92, thin-film resin layer 182 is laminated to thin-film resin layer 182. In this way, by repeating the ejection of an ultraviolet curable resin and the irradiation using ultraviolet rays, multiple resin layers 182 are laminated, and resin laminated body 180 is formed in the gap of cavity 132 other than where electronic component 96 is fixed. Note that the height of resin laminated body 180 is substantially the same as the height of resin laminated body 130. This causes the upper face of resin laminated body 130 and the upper face of resin laminated body 180 to be flush with each other.

Next, when resin laminated body 180 has been formed in the gap of cavity 132 other than where electronic component 96 is fixed, resin layer is formed at a planned formation position of wiring over the upper face of resin laminated body 180 and the upper face of resin laminated body 130. Then, the wiring is formed on the resin layer. However, since the method of forming the resin layer onto the planned formation position of wiring and the method of forming the wiring onto the resin layer are similar to the formation methods in the first embodiment, they are not described.

In this way, even in circuit forming device 10 of the second embodiment, by fixing electronic component 96 with an ultraviolet curable resin and forming a wiring onto the resin layer formed over the upper face of resin laminated body 180 and upper face of resin laminated body 130, it is possible to provide the same effects as those provided by circuit forming device 10 of the first embodiment.

In circuit forming device 10 of the second embodiment, by irradiating with ultraviolet rays ultraviolet curable resin 170 before electronic component 96 is placed, the viscosity of ultraviolet curable resin 170 is increased. By this, the holding power on electronic component 96 by ultraviolet curable resin 170 before being cured is increased, and, even if stage 52 is moved before ultraviolet curable resin 170 is cured, it is possible to prevent, for example, positional deviation of electronic component 96.

Moreover, in circuit forming dec ice 10 of the second embodiment, ultraviolet curable resin 170 is ejected over the entire bottom face of cavity 132, and, by curing ultraviolet curable resin 170, ultraviolet curable resin 170 is cured and electronic component 96 is fixed. Then, b, laminating multiple resin layers 182 to ultraviolet curable resin 170, that is, fixing layer 170, that has been cured, resin laminated body 180 is formed. By this, in circuit forming device 10 of the second embodiment, when fixing layer 170 for fixing electronic component 96 is formed, the lowest layer of resin laminated body 180 is formed. That is, fixing layer 170 for fixing electronic component 96 is the lowest layer of resin laminated body 180. Therefore, it is possible to reduce the time for forming resin laminated body 180, and throughput is increased.

Note that, as shown in FIG. 2, controller 120 of control device 27 includes ejecting section 200, placing section 202, fixing section 204, resin layer laminating section 206, resin layer forming section 208, wiring forming section 210, and viscosity increasing section 212. Ejecting section 200 is a functional section for ejecting ultraviolet curable resin 137 or ultraviolet curable resin 170 into cavity 132. Placing section 202 is a functional section for placing electronic component 96 onto ultraviolet curable resin 137 or ultraviolet curable resin 170. Fixing section 204 is a functional section for curing ultraviolet curable resin 137 or ultraviolet curable resin 170 and fixing electronic component 96. Resin layer laminating section 206 is a functional section for laminating resin layers 152 or resin layers 182 in a gap of cavity 132 other than where electronic component 96 is fixed and forming resin laminated body 150 or resin laminated body 180. Resin layer forming section 208 is a functional section for forming resin layer 160 over the upper face of resin laminated body 130 and the upper face of resin laminated body 150, or a functional section for forming a resin layer over the upper face of resin laminated body 130 and the upper face of resin laminated body 180. Wiring forming section 210 is a functional section for forming wiring 168 onto resin layer 160 formed by resin layer forming section 208. Viscosity increasing section 212 is a functional section for irradiating ultraviolet curable resin 170 with ultraviolet rays and increasing the viscosity of ultraviolet curable resin 170.

Note that, in the embodiments above, board 70 is an example of a board. Inkjet head 88 is an example of an ejecting device. Electronic component 96 is an example of a component. Cavity 132 is an example of a cavity. A step performed by ejecting section 200 is an example of an ejection step. A step performed by placing section 202 is an example of a placement step. A step performed by fixing section 204 is an example of a fixation step. A step performed by resin layer laminating section 206 is an example of a resin layer lamination step. A step performed by resin layer forming section 208 is an example of a resin layer formation step. A step performed by wiring forming section 210 is an example of a wiring formation step. A step performed by viscosity increasing section 212 is an example of an ultraviolet ray irradiation step.

Note that, the present disclosure is not limited to the embodiments above, and various modifications and improvements may be performed based on the knowledge of a person skilled in the art. For example, in the embodiments above, electronic component 96 is mounted inside cavity 132; however, even if electronic component 96 is to be mounted on a location other than cavity 132, electronic component 96 may be fixed with an ultraviolet curable resin.

In the embodiments above, a wiring is formed by sintering metal ink by irradiating the metal ink with laser; however, a wiring may be formed by baking the metal ink with light of a flash lamp or heat of an electric furnace or the like.

In the embodiments above, after fixing electronic component 96 with an ultraviolet curable resin, the gap of cavity 132 other than where electronic component 96 is fixed is filled with, for example, resin laminated body 150, resin layer 160 is formed on the upper faces of, for example, resin laminated body 130 and resin laminated body 150, and wiring 168 is formed on resin layer 160; however, after fixing electronic component 96 with, for example, an adhesive, it is possible to fill the gap of cavity 132 other than where electronic component 96 is fixed with, for example, resin laminated body 150, form resin layer 160 onto the upper faces of, for example, resin laminated body 130 and resin laminated body 150, and forming 168 onto resin layer 160. That is, in the technology of forming resin layer 160 on the upper faces of, for example, resin laminated body 130 and resin laminated body 150 and forming wiring 168 onto resin layer 160, the step of fixing electronic component 96 with an ultraviolet curable resin is not required, and electronic component 96 may be fixed by any method.

REFERENCE SIGNS LIST

70 board
88 inkjet head (ejecting device)
96 electronic component (component)
132 cavity
200 ejecting section (ejection step)
202 placing section (placement step)
204 fixing section (fixation step)
206 resin layer laminating section (resin layer lamination step)
208 resin layer forming section (resin layer formation step)
210 wiring forming section (wiring formation step)
212 viscosity increasing section (ultraviolet ray irradiation step)

The invention claimed is:

1. A method for forming a circuit in which a component is mounted on a board, the method comprising:

forming a resin laminated body on the board by layering and curing an ultraviolet curable resin on the board, the body including a cavity and side walls delimiting the cavity;

ejecting with an ejecting device a first resin layer onto a lower surface of the cavity formed in the body of the board, the first resin layer including the ultraviolet curable resin;

placing the component in the cavity onto the first resin layer including the ultraviolet curable resin; and fixing the component placed in the cavity by irradiating the first resin layer including the ultraviolet curable resin with ultraviolet rays.

2. The method for forming the circuit according to claim 1, further comprising:

forming at least one lamination by ejecting and curing the ultraviolet curable resin on the first resin layer to which the component is fixed a location in the cavity other than where the component is fixed until the at least one lamination has a height that is same as a height of an upper face of the body;

forming a second resin layer including the ultraviolet curable resin over an upper face of the at least one lamination and at least a portion of the upper face of the body; and forming a wiring by ejecting a metal-containing liquid containing metal particles onto an upper face of the at least one lamination and by baking the metal-containing liquid.

3. The method for forming the circuit according to claim 1, further comprising:

before placing the component, irradiating the first resin layer including the ultraviolet curable resin ultraviolet rays to increase viscosity of the ultraviolet curable resin of the first resin layer.

4. The method for forming the circuit according to claim 1, wherein the an area of the ultraviolet curable resin in the first resin layer is larger than a planned mounting position of the component such that outer edges of the ultraviolet curable resin in the first resin layer are at equal distances from outer edges of the planned mounting position.

* * * * *